US010820458B2

(12) United States Patent
Nishiyama

(10) Patent No.: US 10,820,458 B2
(45) Date of Patent: Oct. 27, 2020

(54) COMPONENT MOUNTING DEVICE AND NOZZLE EXCHANGE METHOD USED IN THE COMPONENT MOUNTING DEVICE

(71) Applicant: FUJI MACHINE MFG. CO., LTD., Chiryu (JP)

(72) Inventor: Satoru Nishiyama, Nagoya (JP)

(73) Assignee: FUJI CORPORATION, Chiryu-shi (JP)

( * ) Notice: Subject to any disclaimer, the term of this patent is extended or adjusted under 35 U.S.C. 154(b) by 320 days.

(21) Appl. No.: 15/740,053

(22) PCT Filed: Jul. 21, 2015

(86) PCT No.: PCT/JP2015/070670
§ 371 (c)(1),
(2) Date: Dec. 27, 2017

(87) PCT Pub. No.: WO2017/013733
PCT Pub. Date: Jan. 26, 2017

(65) Prior Publication Data
US 2018/0192556 A1    Jul. 5, 2018

(51) Int. Cl.
*H05K 13/04* (2006.01)
*G06T 7/73* (2017.01)

(52) U.S. Cl.
CPC ........... *H05K 13/0408* (2013.01); *G06T 7/74* (2017.01); *H05K 13/0404* (2013.01); *H05K 13/0409* (2018.08)

(58) Field of Classification Search
CPC .. H05K 13/08; H05K 13/0404; H05K 13/046; H05K 13/04; H05K 3/30;
(Continued)

(56) References Cited

U.S. PATENT DOCUMENTS 5,379,514 A * 1/1995 Okuda ............... H05K 13/0882
29/833
6,002,650 A * 12/1999 Kuribayashi ...... G05B 19/4097
700/117
(Continued)

FOREIGN PATENT DOCUMENTS

JP    2006-261325 A    9/2006

OTHER PUBLICATIONS

International Search Report dated Oct. 27, 2015 in PCT/JP2015/070670 filed Jul. 21, 2015.

*Primary Examiner* — Peter Dungba Vo
*Assistant Examiner* — Kaying Kue
(74) *Attorney, Agent, or Firm* — Oblon, McClelland, Maier & Neustadt, L.L.P.

(57) ABSTRACT

A component mounting device (1) includes: a nozzle station (72), and the nozzle station (72) includes a lifting and lowering member (86) capable of lifting and lowering, a nozzle accommodation device (77) that accommodates multiple types of suction nozzles (66) that correspond to the type of the nozzle tool (60) to be attachable and detachable therein, a positioning device (95) that positions the nozzle accommodation device (77) at multiple height positions in accordance with the type of the nozzle tool (60), and a fiducial mark (78) provided on the nozzle accommodation device (77). An exchange control device (93) includes a fiducial mark position calculating section (93a) that positions the nozzle accommodation device (77) at multiple height positions, and calculates each of the positions of the fiducial marks (78) at the multiple height positions, and a nozzle exchange control section (93b) that exchanges the suction nozzle (66) by aligning the nozzle tool (60) with respect to the nozzle accommodation device (77) using the calculated position of the fiducial mark (78) as a reference when the nozzle accommodation device (77) is positioned at the multiple height positions in accordance with the exchange of the nozzle tool (60).

4 Claims, 8 Drawing Sheets

(58) Field of Classification Search
CPC ..... H05K 3/301; H01L 33/56; H01L 33/0095; H01L 51/56; Y10T 29/53174; Y10T 29/53178; Y10T 29/53183; Y10T 29/53191; Y10T 29/53039; Y10T 29/4913; Y10T 29/49146
USPC ......... 29/729, 701, 832, 739–741, 855, 856, 29/857
See application file for complete search history.

(56) References Cited

U.S. PATENT DOCUMENTS

| | | | | |
|---|---|---|---|---|
| 6,334,115 B1* | 12/2001 | Kuribayashi | ........ | H05K 13/085 705/27.2 |
| 6,519,838 B1* | 2/2003 | Okuda | ............... | H05K 13/0409 29/740 |
| 6,868,603 B2* | 3/2005 | Okuda | ............... | H05K 13/0409 29/832 |
| 7,127,459 B2* | 10/2006 | Kuribayashi | ........... | G06F 30/00 |
| 7,603,766 B2 | 10/2009 | Kawada | | |
| 7,897,419 B2* | 3/2011 | Donofrio | .............. | H01L 33/005 257/88 |
| 8,019,455 B2* | 9/2011 | Maenishi | ............. | H05K 13/085 700/99 |
| 8,193,544 B2* | 6/2012 | Donofrio | .............. | H01L 33/005 257/88 |
| 8,288,777 B2* | 10/2012 | Peng | ....................... | H01L 24/32 257/100 |
| 8,871,538 B2* | 10/2014 | Kim | ....................... | H01L 33/50 438/29 |
| 8,877,524 B2* | 11/2014 | Chitnis | ............... | H01L 33/0095 438/14 |
| 8,881,385 B2* | 11/2014 | Endo | .................. | H05K 13/0452 29/840 |
| 9,017,822 B2* | 4/2015 | Fukunaga | .............. | B29C 39/10 257/788 |
| 9,040,314 B2* | 5/2015 | Abe | ........................ | H01L 22/24 118/697 |
| 9,048,177 B2* | 6/2015 | Abe | ........................ | H01L 24/27 |
| 2002/0073536 A1* | 6/2002 | Okuda | ................. | H05K 13/041 29/740 |
| 2004/0080897 A1* | 4/2004 | Kodama | ........... | H05K 13/0882 361/234 |
| 2010/0229380 A1* | 9/2010 | Endo | .................. | H05K 13/0409 29/760 |
| 2010/0230696 A1* | 9/2010 | Fukunaga | ........... | H01L 23/3142 257/98 |
| 2010/0257728 A1* | 10/2010 | Hiraki | ................... | H01L 24/743 29/739 |

\* cited by examiner

COMPONENT MOUNTING DEVICE AND NOZZLE EXCHANGE METHOD USED IN THE COMPONENT MOUNTING DEVICE

TECHNICAL FIELD

The present invention relates to a component mounting device for automatically exchanging a suction nozzle and a nozzle tool that holds the suction nozzle, and a nozzle exchange method which is used in the component mounting device.

BACKGROUND ART

A component mounting device uses a suction nozzle to pick up an electronic component supplied to a pickup position, and mounts the electronic component at a predetermined coordinate position (mounting position) on a circuit board. As such a component mounting device, as described in PTL 1, there is a device in which a nozzle tool that holds the suction nozzle is exchangeably attached to a component transfer device. A nozzle tool for exchange is stored in a tool station provided in the component mounting device. With the component mounting device, the nozzle tool is automatically exchanged to a nozzle tool that corresponds to the type or the like of the electronic component to be mounted by controlling operations of the component transfer device that holds the nozzle tool.

However, in recent years, with respect to the component transfer device, tests have been performed in which multiple types of nozzle tools with varying quantities of suction nozzles are attached automatically. When the quantity of suction nozzles varies, the size (the length and the diameter) of the suction nozzles varies, and depending on the type of the nozzle tool attached to the component transfer device, height positions of the suction nozzles with respect to the component transfer device respectively vary.

CITATION LIST

Patent Literature

PTL 1: JP-A-2006-261325

SUMMARY OF INVENTION

Technical Problem

When automatically exchanging suction nozzles with respect to multiple types of nozzle tools, it is necessary to provide a nozzle accommodation device, which accommodates multiple types of suction nozzles, in the nozzle station provided in the component mounting device, and further, when exchanging suction nozzles, it is necessary to change the height position of the nozzle accommodation device in accordance with the type of the nozzle tool.

However, when positioning the nozzle accommodation device at different height positions in accordance with the type of the nozzle tool attached to the component transfer device, depending on the accuracy of a lifting and lowering mechanism that lifts and lowers the nozzle accommodation device, a position (a position of an accommodation section) of a fiducial mark of the nozzle accommodation device with respect to the reference position finely changes in accordance with the height position. Therefore, a positional deviation arises between the nozzle accommodation device and the nozzle tool, and nozzle exchange is not stably performed.

The present invention takes account of such problems, and an object thereof is to provide a component mounting device that reduces influence of a positional deviation of a nozzle accommodation device with respect to a reference position that arises between multiple height positions of a nozzle accommodation device, and a nozzle exchange method used in the component mounting device.

Solution to Problem

According to the present invention, there is provided a component mounting device including: a component transfer device to which a nozzle tool that removably holds a suction nozzle is removably attached, the component transfer device being configured to transfer an electronic component picked up by the suction nozzle to a mounting position on a board by moving the nozzle tool; a tool station configured to store the nozzle tool for exchange therein; a nozzle station configured to store the suction nozzle for exchange therein; and an exchange control device configured to attach the nozzle tool for exchange stored in the tool station to the component transfer device, and attach the nozzle for exchange accommodated in the nozzle station to the nozzle tool, wherein the nozzle station includes a lifting and lowering member capable of lifting and lowering, a nozzle accommodation device which is provided on the lifting and lowering member, and removably accommodates multiple types of the suction nozzles that correspond to the type of the nozzle tool, a positioning device configured to position the nozzle accommodation device on the lifting and lowering member at multiple height positions in accordance with the type of the nozzle tool attached to the component transfer device, and a fiducial mark provided on the nozzle accommodation device, and wherein the exchange control device includes a fiducial mark position calculating section configured to, when the nozzle accommodation device is positioned at the multiple height positions using the positioning device, recognize each of the fiducial marks at the multiple height positions, and calculate each of the positions of the fiducial marks at the multiple height positions based on the recognition results, and a nozzle exchange control section configured to, when the nozzle accommodation device is positioned at the multiple height positions in accordance with the exchange of the nozzle tool, exchange the suction nozzle by aligning the nozzle tool with respect to the nozzle accommodation device using the position of the fiducial mark calculated by the fiducial mark position calculating section as a reference.

Advantageous Effects of Invention

According to the present invention, since each of the positions of the fiducial marks is calculated at the multiple height positions in advance, and the position is corrected during nozzle exchange, in accordance with exchange to a different type of nozzle tool, when the nozzle accommodation device is positioned at the multiple height positions, it is possible to eliminate influence of a positional deviation of the nozzle accommodation device with respect to a reference position that arises between each of the height positions, and to stably perform exchange of suction nozzles with respect to the multiple types of nozzle tools without a mistake.

DESCRIPTION OF EMBODIMENTS

Hereinafter, embodiments of the present invention will be described based on the drawings. A component mounting device according to an embodiment of the present invention is a device that uses a suction nozzle picks up an electronic component supplied to a nozzle pickup position, and mounts the electronic component to a predetermined coordinate position (mounting position) on a circuit board.

1. Overall Configuration of Component Mounting Device 1

Figure 1:
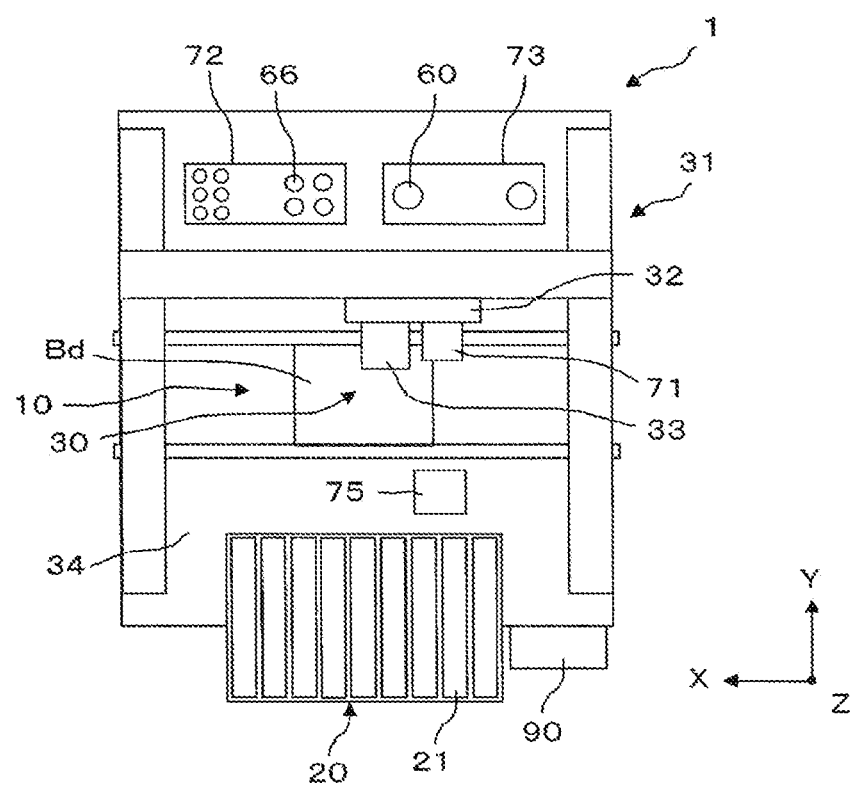
FIG. 1 is a schematic plan view illustrating an entire component mounting device according to an embodiment of the present invention.

As illustrated in FIG. 1, component mounting device 1 includes board conveyance device 10, component supply device 20, component transfer device 30, board camera 71, component camera 75, nozzle station 72, tool station 73, and control device 90. In the following description, a horizontal width direction (left-right direction of FIG. 1) of component mounting device 1 is an X-axis direction, a horizontally longitudinal direction (up-down direction of FIG. 1) of component mounting device 1 is a Y-axis direction, and a vertical direction (direction perpendicular to the page in FIG. 1) perpendicular to the X-axis and the Y-axis is a Z-axis direction.

Board conveyance device 10 is configured of a belt conveyor or the like, and transports a board Bd along the X-axis direction. Board conveyance device 10 positions the board Bd at a predetermined position in component mounting device 1. In addition, board conveyance device 10 discharges the board Bd to the outside of component mounting device 1 after a mounting process has been performed by component mounting device 1.

Component supply device 20 supplies electronic components to be mounted on the board Bd. Component supply device 20 has multiple slots lined up in the X-axis direction. Feeders 21 are respectively removably attached to the multiple slots. Component supply device 20 feeds a carrier tape using feeder 21, and supplies the electronic component to the nozzle pickup position positioned on a distal end side (upper side of FIG. 1) of feeder 21.

Component transfer device 30 is configured to be movable in the X-axis direction and in the Y-axis direction. Component transfer device 30 is disposed from a rear portion side (upper side of FIG. 1) in the longitudinal direction of component mounting device 1 to an upper part of component supply device 20 on a front portion side. Component transfer device 30 includes XY-robot 31, moving body 32, and head unit 33. XY-robot 31 is configured such that moving body 32 can move in the XY-axis direction by a linear motion mechanism. Head unit 33 is removably provided on moving body 32 of XY-robot 31.

Figure 2:
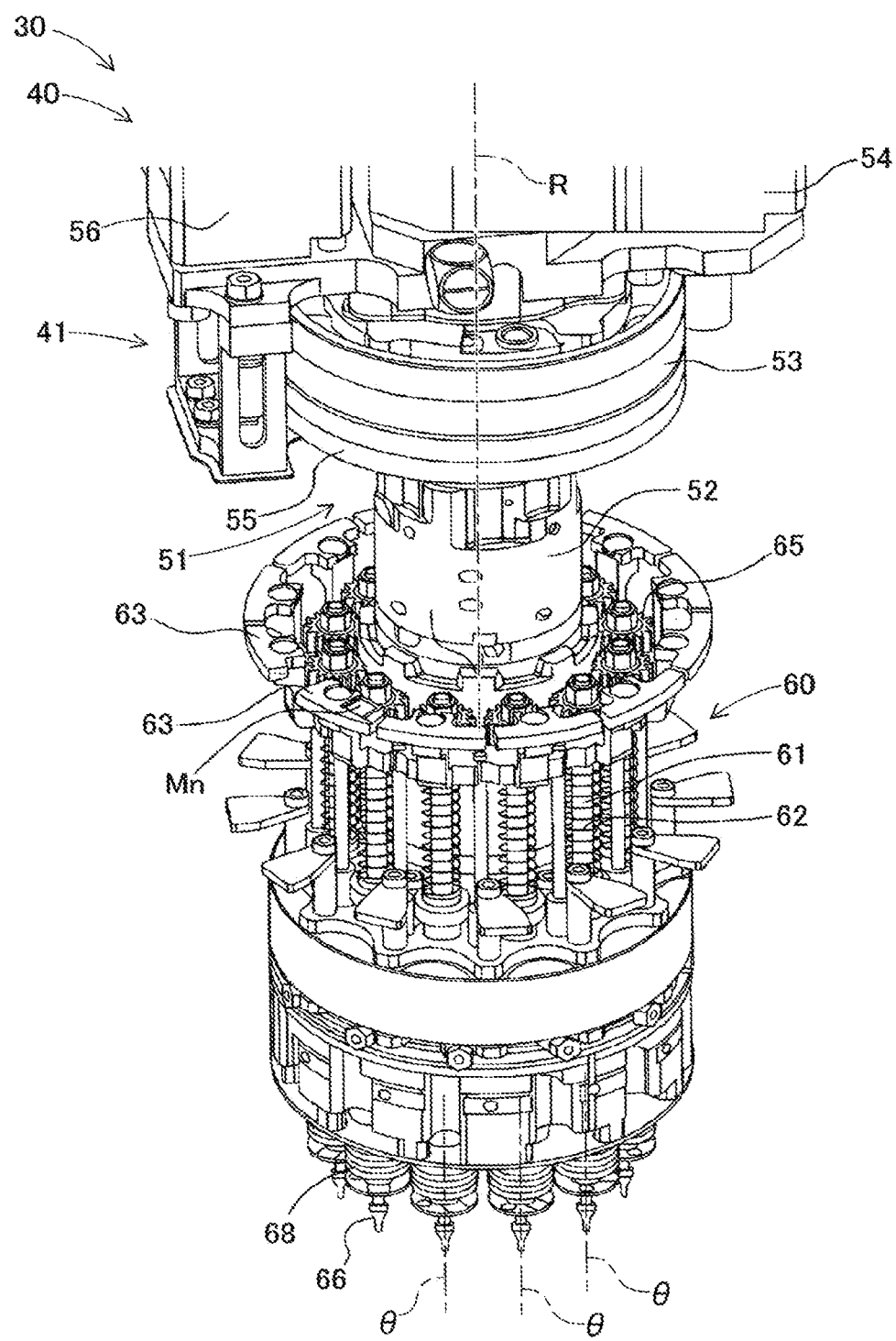
FIG. 2 is a perspective view illustrating a nozzle tool in a state removed from a head main body of a head unit.

In addition, head unit 33 supports multiple suction nozzles 66 to be rotatable around an R-axis parallel to the Z-axis, and to be capable of moving up and down (refer to FIG. 2). For suction nozzles 66, a vertical position with respect to head unit 33, an angle, and a supply state of a negative pressure are controlled. Suction nozzle 66 picks up and holds an electronic component supplied to the nozzle pickup position of feeder 21 by the supply of negative pressure. Component transfer device 30 transfers the electronic component held by suction nozzle 66 to the mounting position on the board Bd by operations of XY-robot 31 and head unit 33. The specific configuration of component transfer device 30 will be described later.

Board camera 71 is fixed to moving body 32 of component transfer device 30 such that an optical axis is oriented downward in the Z-axis direction. Component camera 75 is fixed onto base 34 of component mounting device 1 such that the optical axis is oriented upward in the Z-axis direction. Component camera 75 is configured to be capable of imaging an electronic component held by suction nozzle 66.

Board camera 71 is configured to be capable of imaging the board Bd when moving body 32 is moved above the board Bd positioned by board conveyance device 10. An image of the board Bd obtained by the imaging performed by board camera 71 is used in recognizing the position of the board Bd positioned by the board conveyance device 10, for example, during processing of mounting electronic components.

Nozzle station 72 stores multiple suction nozzles 66. The multiple types of suction nozzles 66 are provided in accordance with the type of nozzle tool 60, and are accommodated in nozzle accommodation device 77 (refer to FIG. 4) removably provided on nozzle station 72. Nozzle accommodation device 77 will be described in detail later.

Tool station 73 stores the multiple types of nozzle tools 60. The multiple types of nozzle tools 60 that can be attached to component transfer device 30 are respectively accommodated in the multiple tool accommodation sections provided in tool station 73. Nozzle station 72 and tool station 73 are disposed on the inside of a movable region of component transfer device 30 in component mounting device 1. Accordingly, component mounting device 1 is configured to be capable of automatically exchanging suction nozzle 66 or nozzle tool 60 in accordance with the type of the board Bd to be produced or the like.

Hereinafter, an example will be described in which two types of nozzle tools 60, of which the number of held nozzles varies (for example, twelve and four nozzles), are stored in tool station 73, nozzle tools 60 are automatically exchanged between tool station 73 and component transfer device 30, two types of suction nozzles 66 which correspond to the type of nozzle tool 60 are stored in nozzle station 72, and the suction nozzles 66 are automatically exchanged between nozzle station 72 and nozzle tool 60. In addition, for convenience, hereinafter, nozzle tool 60 of which the number of held nozzles is twelve is referred to as an A type, nozzle tool 60 of which the number of held nozzles is four is referred to as a B type, suction nozzle 66 which can be mounted on the A type of nozzle tool 60 is referred to as an A type, and suction nozzle 66 which can be mounted on the B type of nozzle tool 60 is referred to as a B type.

Control device 90 is mainly configured of a CPU or various types of memories, and a control circuit. Control device 90 includes a storage device or the like that stores mounting data for operating component mounting device 1, and image data or the like transferred from board camera 71 and component camera 75. Control device 90 performs image processing using the obtained image data. Control device 90 corrects operation of component supply device 20 or the component transfer device 30 based on the state of the electronic component or the board Bd recognized by the image processing. Accordingly, control device 90 controls the mounting process of the electronic component.

In addition, control device 90 controls an exchange process for automatically exchanging suction nozzle 66 and nozzle tool 60 in accordance with the mounting data or the state of suction nozzle 66. More specifically, control device 90 executes exchange processing in order to change suction nozzle 66 and nozzle tool 60 to the suction nozzle 66 and the nozzle tool 60 that correspond to the type of the electronic component to be mounted, and in order to change an suction nozzle 66 of which an exchange time has been reached to a new suction nozzle 66. A specific configuration of control device 90, and exchange processing of nozzle tool 60 and exchange processing of suction nozzle 66, will be described in detail.

As described above, component transfer device 30 includes head unit 33 removably fixed to moving body 32. Head unit 33 holds nozzle tool 60 to which suction nozzles 66 are removably attached. As illustrated in FIG. 2, head unit 33 includes mounting head 40 and nozzle tool 60.

Mounting head 40 is a driving device configured of head main body 41 and tool holding device 51. In head main body 41, a clamp mechanism and various types of connectors (not illustrated) for fixing head unit 33 to moving body 32, are provided. Tool holding device 51 is a device provided to be capable of moving up and down with respect to head main body 41 and rotatable around a rotation axial line, and which holds nozzle tool 60.

Figure 3:
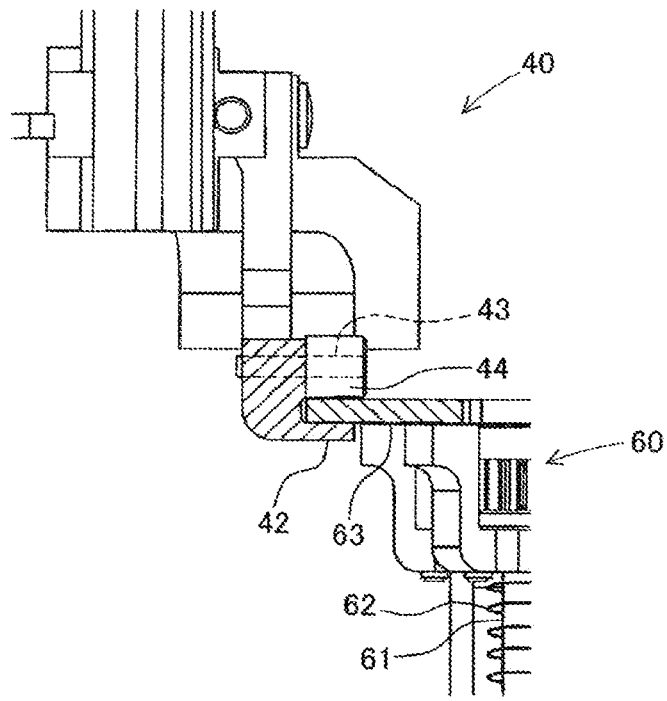
FIG. 3 is a view illustrating a configuration of main sections of a nozzle operation mechanism.

More specifically, in head main body 41, a nozzle operation mechanism that lifts and lowers nozzle holder 61 attached to nozzle tool 60 is provided. In a lower end portion of nozzle holder 61, suction nozzle 66 is removably held to by a nozzle holding device 68 (refer to FIG. 2). The nozzle operation mechanism operates a linear motion mechanism, such as a ball screw mechanism, by the driving of a Z-axis motor (not illustrated) fixed to head main body 41. In the linear motion mechanism, as illustrated in FIG. 3, nozzle lever 42, roller shaft 43, and roller 44, are provided.

Nozzle lever 42 is formed such that a section has an L shape to be engageable with lever engaging piece 63 of nozzle tool 60 from below. Roller shaft 43 is a columnar member extending in the horizontal direction, and is fixed to nozzle lever 42. Roller 44 is provided to be rotatable on the outer circumferential side of roller shaft 43. Roller 44 is disposed such that a predetermined interval is formed between an outer peripheral surface of roller 44 and an engagement surface of nozzle lever 42 positioned at a lower part.

The nozzle operation mechanism of head main body 41 configured in this manner lifts and lowers nozzle lever 42 and roller 44 in a state of holding lever engaging piece 63 of nozzle tool 60 in an engaging groove formed by nozzle lever 42 and roller 44. Accordingly, the nozzle operation mechanism lifts and lowers the suction nozzle 66 attached to the nozzle holder 61 in the Z-axis direction via the nozzle holder 61 in which the lever engaging piece 63 is formed.

Tool holding device 51 has index shaft 52 supported to be rotatable on head main body 41. Index shaft 52 is linked to R-axis motor 54 via R-axis driven gear 53 (a tooth surface is not illustrated in FIG. 2) which is integrally fixed to the upper end portion. Index shaft 52 indexes each time by a predetermined rotation angle by operation of R-axis motor 54. Index shaft 52 removably holds nozzle tool 60 by a clamp mechanism (not illustrated) provided on the lower end portion.

In addition, on the outer circumferential side of index shaft 52, θ-axis driven gear 55 (a tooth surface is not illustrated in FIG. 2) made in a cylindrical shape, is disposed. θ-axis driven gear 55 is supported to be relatively rotatable with respect to index shaft 52, and rotates around the R-axis by the driving of θ-axis motor 56. In the lower end portion of θ-axis driven gear 55, a clutch section (not illustrated) linked to θ-axis cylindrical gear 64, which will be described later, is formed.

Nozzle tool 60 removably holds the multiple suction nozzles 66. In nozzle tool 60, a type that holds one suction nozzle 66 is included. Various types of nozzle tools 60 are appropriately exchanged in accordance with the type or the mounting process of the electronic components. Nozzle tool 60 holds twelve or four suction nozzles 66 at an equal interval in the circumferential direction on a circumference concentric to the R-axis in a state of being held by tool holding device 51.

More specifically, as illustrated in FIG. 2, nozzle tool 60 holds the multiple nozzle holders 61 to be slidable in the Z-axis direction and rotatable. Nozzle holder 61 is biased upward with respect to the main body of nozzle tool 60 by an elastic force of spring 62. Accordingly, nozzle holder 61 is positioned at an upper end in a normal state in which an external force is not being applied.

In addition, on an upper face of lever engaging piece 63, an information code Mn is given. The information code has information including the type and the identification number of the nozzle tool 60, and is used in recognition processing of the nozzle tool 60. Here, recognition processing of the nozzle tool 60 is processing for obtaining the type and the identification number of the nozzle tool 60 accommodated in tool station 73 and for being associated with a tool accommodation position in tool station 73. As the information code, any of a bar code or a two-dimensional code, a character string, a pattern, color, or a combination thereof, may be employed.

Nozzle tool 60 includes θ-axis cylindrical gear 64 held to be rotatable around the rotation axial line with respect to the main body section which holds the multiple nozzle holders 61. θ-axis cylindrical gear 64 is formed in a cylindrical shape. An inner diameter of θ-axis cylindrical gear 64 is set to be smaller than an outer diameter of index shaft 52 of tool holding device 51. Nozzle tool 60 is held by the clamp mechanism of index shaft 52 which penetrates the inner circumferential side of θ-axis cylindrical gear 64, and nozzle tool 60 is lifted and lowered by tool holding device 51.

In θ-axis cylindrical gear 64, in a state where nozzle tool 60 is positioned at the upper end, the clutch section formed in the upper portion of θ-axis cylindrical gear 64 is linked to the clutch section formed in θ-axis driven gear 55. In this manner, θ-axis cylindrical gear 64 is configured to be rotatable to be integrated with θ-axis driven gear 55, and rotates around the R-axis by the driving of θ-axis motor 56.

On the outer peripheral surface of θ-axis cylindrical gear 64, an external gear is formed (a tooth surface is not illustrated in FIG. 2).

At the upper end portion of nozzle holder 61, nozzle gear 65 that rotates integrally with nozzle holder 61 around the θ-axis, is provided. Nozzle gear 65 is meshed with the external gear of θ-axis cylindrical gear 64 to be slidable in the rotation axial line direction. Suction nozzle 66 picks up an electronic component by negative pressure air being supplied via an air passage from a negative pressure air supply device, which is not illustrated.

By such a configuration, when θ-axis motor 56 is driven, θ-axis driven gear 55 and θ-axis cylindrical gear 64 rotate around the R-axis. Accordingly, each of the nozzle holders 61, each of the nozzle gears 65, and each of the suction nozzles 66 rotate (revolve) around each of the rotation axes (θ-axis). In addition, each of the suction nozzles 66 is consecutively indexed at the predetermined angle position around the R-axis as nozzle tool 60 rotates via index shaft 52 in accordance with the driving of R-axis motor 54.

Figure 4:
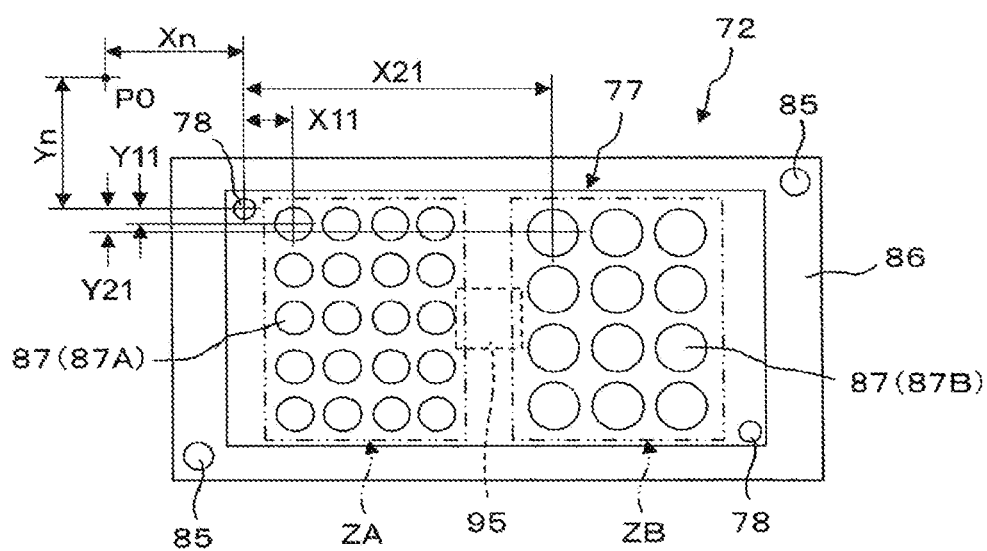
FIG. 4 is a plan view illustrating a nozzle accommodation device of a nozzle station.

In nozzle station 72, as illustrated in FIG. 4, nozzle accommodation device 77 that accommodates the multiple types of suction nozzles 66 removably mounted on nozzle tool 60, is installed. In nozzle station 72, lifting and lowering member 86 is guided to be capable of moving up and down via guide member 85, and nozzle accommodation device 77 is placed to be removable and to be capable of being positioned by a positioning pin or the like, which is not illustrated, on lifting and lowering member 86. On nozzle accommodation device 77, one pair of fiducial marks 78 is provided.

In the embodiment, nozzle accommodation device 77 accommodates the two types of suction nozzles 66 mounted on a different type of nozzle tool 60. In other words, in nozzle accommodation device 77, for example, an accommodation hole 87 (87A) that accommodates the multiple suction nozzles (A type of suction nozzles) 66 mounted on the nozzle tool (A type of nozzle tool) 60 of which the number of held nozzles is twelve, and for example, an accommodation hole 87 (87B) that accommodates the multiple suction nozzles (B type of suction nozzles) 66 mounted on the nozzle tool (B type of nozzle tool) 60 of which the number of held nozzles is four therein, are disposed to be divided into accommodation zones ZA and ZB respectively.

The multiple accommodation holes 87A for accommodating the A type of suction nozzle 66 are respectively arranged in a positional relationship (X11, Y11, . . . ) determined in advance in the X-axis and Y-axis directions with respect to fiducial marks 78. Similarly, the multiple accommodation holes 87B for accommodating the B type of suction nozzle 66 are respectively arranged in a positional relationship (X21, Y22, . . . ) determined in advance in the X-axis and Y-axis directions with respect to fiducial marks 78.

Figure 5:
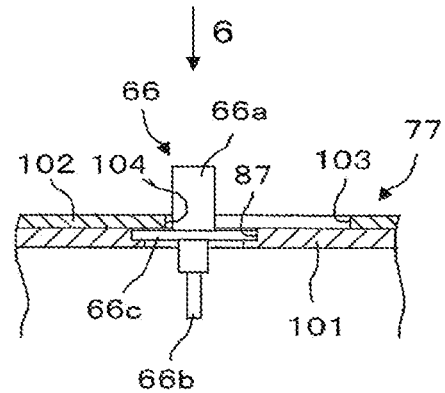
FIG. 5 is a sectional view illustrating a state where a suction nozzle is accommodated in an accommodation hole of the nozzle accommodation device.
Figure 6:
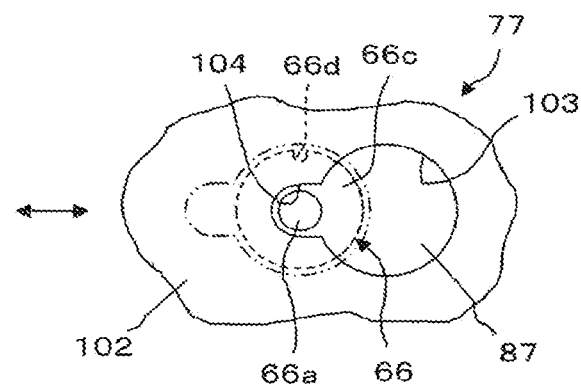
FIG. 6 is a top view of the accommodation hole when viewed from the direction of arrow 6 of FIG. 5.

In the accommodation hole 87 (87A and 87B) of nozzle accommodation device 77, as illustrated in FIGS. 5 and 6, suction nozzle 66 is removably held in a posture in which nozzle section 66c is oriented downward. Nozzle accommodation device 77 includes base plate 101 on which the accommodation holes 87 (87A and 87B) are formed, and cover plate 102 that covers an upper face of base plate 101. Cover plate 102 is slidable by a predetermined amount in the direction of the arrow in FIG. 6 with respect to base plate 101. Accommodation hole 87 is a stepped hole, and flange section 66b of suction nozzle 66 is placed on a step surface of the stepped hole. At an outer circumference of flange section 66b, notch 66d is formed, and a pin, which is not illustrated, that engages with notch 66d is provided on a step surface of accommodation hole 87. By the engagement of notch 66d and the pin, suction nozzle 66 is placed at a determined angle, and rotation of suction nozzle 66 is prevented.

Meanwhile, in cover plate 102, circular escape hole 103 is formed corresponding to accommodation hole 87, and slot portion 104 is formed at a part of an inner circumference of escape hole 103. Escape hole 103 is formed to have an inner diameter which is substantially the same as that of accommodation hole 87, and the width of slot portion 104 is slightly greater than the outer diameter of shaft section 66a of suction nozzle 66 inserted into nozzle holder 61.

By the sliding of cover plate 102 with respect to base plate 101, a state changes between a state where accommodation hole 87 matches escape hole 103 and a state where accommodation hole 87 is blocked by slot portion 104. Cover plate 102 is biased in a direction of blocking accommodation hole 87 by a spring that is not illustrated, and usually, suction nozzle 66 does not protrude from nozzle accommodation device 77. In addition, when removing suction nozzle 66, cover plate 102 is operated against the spring by an actuating device that is not illustrated.

However, while the multiple suction nozzles 66 mounted on the A type nozzle tool 60 of which the number of held nozzles is twelve are appropriate for picking up relatively small electronic components, the multiple suction nozzles 66 mounted on the B type nozzle tool 60 of which the number of held nozzles is four are appropriate for picking up large electronic components. Therefore, with suction nozzle 66 mounted on nozzle tool 60 of which the number of held nozzles is four, the length from flange section 66b of suction nozzle 66 to the distal end of nozzle section 66c is long, and diameter of nozzle section 66c is large, compared to suction nozzles 60 of nozzle tool 60 of which the number of held nozzles is twelve.

Due to the above relationships, in order to exchange suction nozzle 66, when nozzle tool 60 mounted on component transfer device 30 is positioned above nozzle station 72, in accordance with the type of nozzle tool 60 and the type of suction nozzle 66 attached, the height position of flange section 66b of suction nozzle 66 varies.

Figure 7:
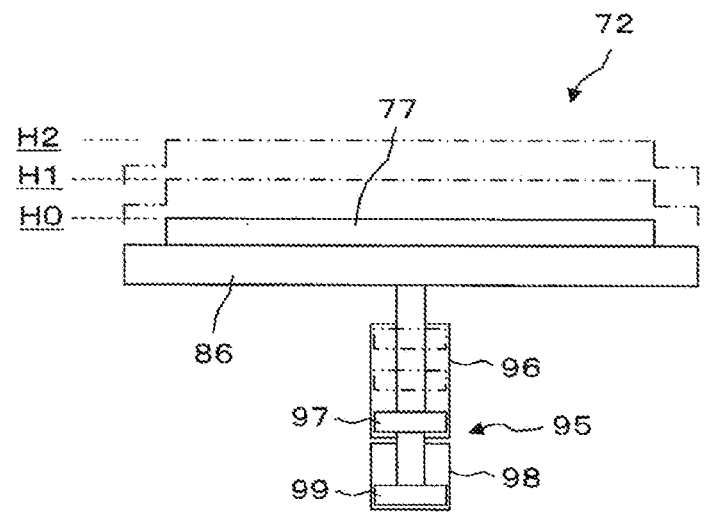
FIG. 7 is a schematic view illustrating a positioning device that positions the nozzle accommodation device at multiple height positions.

Therefore, as illustrated in FIG. 7, lifting and lowering member 86 on which nozzle accommodation device 77 is placed can be positioned at three height positions including a lower level position H0 that is a retraction position, a middle level position H1 that is a first exchange position, and an upper level position H2 that is a second exchange position, by cylinder device 95 that is a positioning device. In order to position lifting and lowering member 86 at the three height positions, cylinder device 95 has, for example, a double cylinder structure in which piston rod 97 fitted to a first cylinder 96 and piston rod 99 fitted to a second cylinder 98 are directly linked to each other. In addition, the lower level position H0 and the upper level position H2 are formed by a lower end position and an upper end position of piston rod 97 of the first cylinder 96, and the middle level position H1 is formed as piston rod 97 of the first cylinder 96 abuts against piston rod 99 of the second cylinder 98 positioned at the upper end position.

2. Specific Configuration of Control Device 90

Figure 8:
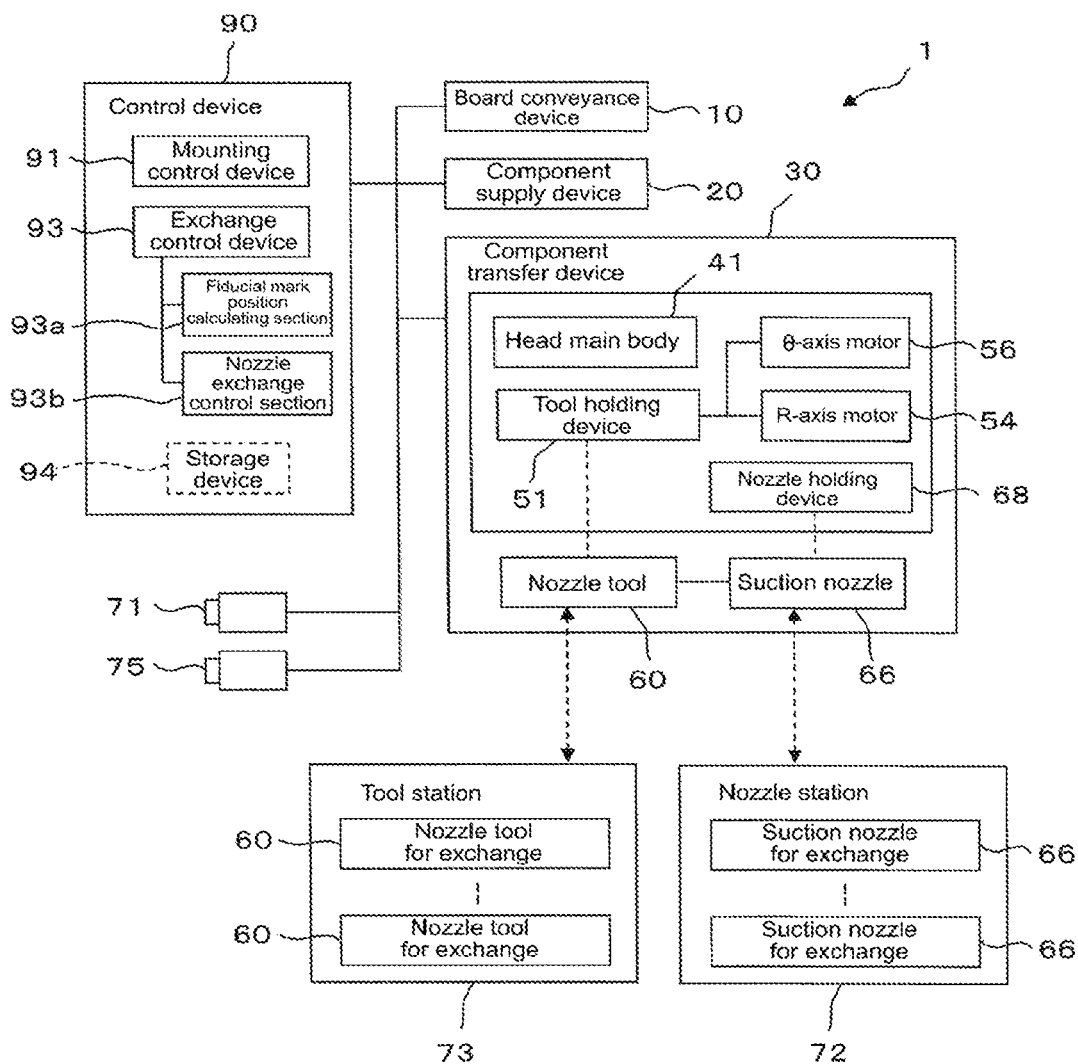
FIG. 8 is a view illustrating a control block for controlling the component mounting device.

As illustrated in FIG. 8, control device 90 includes mounting control device 91 and exchange control device 93 that controls exchange of nozzle tools 60 and suction nozzles 66. Exchange control device 93 includes fiducial mark position calculating section 93a and nozzle exchange control section 93b, which will be described later.

Mounting control device 91 controls the position and the operation of head unit 33 via a motor control circuit. More specifically, mounting control device 91 inputs information output from various sensors and results of various recognition processing, in the mounting process of the electronic component. In addition, mounting control device 91 feeds a control signal to the motor control circuit based on the mounting data stored in storage device 94, information from various sensors, and results of image processing and recognition processing. Accordingly, the position of suction nozzle 66 held by nozzle tool 60 and the rotation angle around the θ-axis are controlled.

In addition, in the above-described recognition processing, recognition processing in a state where the board Bd and the nozzle accommodation device 77 (refer to FIG. 4) are positioned, is included. In the recognition processing, by using an image of the board Bd obtained by the imaging performed by board camera 71 provided in component transfer device 30, the board mark given at a defined position of the board Bd is recognized by the image processing, and as will be described later, by using an image of nozzle accommodation device 77 obtained by the imaging performed by board camera 71, fiducial marks 78 given at defined positions of nozzle accommodation device 77 are recognized by the image processing. Mounting control device 91 recognizes the position of the board Bd based on a control position of XY-robot 31 when imaging the board Bd, and the position of the board mark in the image.

3. Exchange Processing of Nozzle Tools)

Control device 90 of component mounting device 1 executes tool exchange processing for automatically exchanging nozzle tool 60 in accordance with the mounting data or the state of suction nozzle 66. In exchange processing of nozzle tool 60, first, control device 90 (exchange control device 93) moves head unit 33 to tool station 73. Accordingly, control device 90 positions tool holding device 51 on which nozzle tool 60 is mounted above an empty tool accommodation section in tool station 73. Next, control device 90 further lowers tool holding device 51 such that nozzle tool 60 is accommodated in the empty tool accommodation section of tool station 73.

Control device 90 releases the clamp mechanism of index shaft 52 and lifts tool holding device 51, in a state with nozzle tool 60 accommodated in the tool accommodation section. Accordingly, tool holding device 51 is disengaged from nozzle tool 60. Next, control device 90 moves head unit 33, and positions tool holding device 51 above the tool accommodation section in which the nozzle tool for exchange 60 to be used next is accommodated. At this time, control device 90 images the nozzle tool for exchange 60 accommodated in the tool accommodation section using board camera 71, obtains an image of nozzle tool 60, and stores the image in the storage device.

Control device 90 lowers tool holding device 51, and inserts index shaft 52 to the inner circumferential side of θ-axis cylindrical gear 64 of nozzle tool 60. After this, control device 90 operates the clamp mechanism of index shaft 52, and holds the nozzle tool for exchange 60 in tool holding device 51. In addition, control device 90 lifts tool holding device 51 and removes nozzle tool 60 from tool station 73. As described above, control device 90 exchanges nozzle tool 60 by executing accommodation processing and attachment processing of nozzle tool 60.

4. Fiducial mark Position Calculation Process

In addition, control device 90 (exchange control device 93) of component mounting device 1 executes nozzle exchange control processing for automatically exchanging suction nozzle 66 that corresponds to the type of nozzle tool 60 mounted on component transfer device 30, in accordance with exchange of nozzle tool 60. Hereinafter, nozzle exchange control processing for exchanging suction nozzle 66 with respect to nozzle tool 60 will be described.

Figure 9:
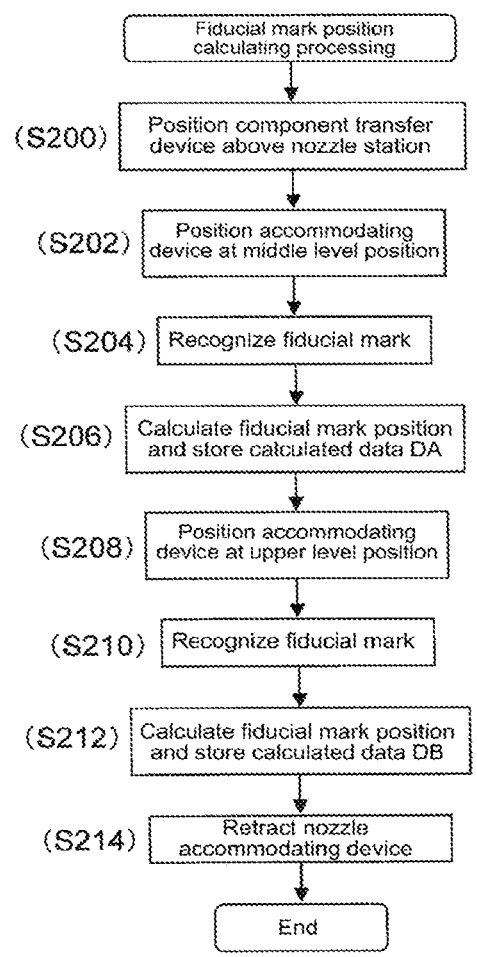
FIG. 9 is a flowchart illustrating nozzle exchange preparation processing.

As a preparation stage (previous stage) for executing nozzle exchange control processing, control device 90 executes fiducial mark position calculation processing for calculating the position of fiducial mark 78 provided in nozzle accommodation device 77 on lifting and lowering member 86 before producing the board Bd using component mounting device 1. Hereinafter, a program of fiducial mark position calculation processing will be described based on the flowchart of FIG. 9.

In step S200, control device 90 moves component transfer device 30 to an upper position of nozzle station 72, and is positioned at a position at which it is possible to recognize fiducial mark 78 provided on nozzle accommodation device 77 installed on nozzle station 72 using board camera 71.

Next, in step S202, control device 90 lifts lifting and lowering member 86 on nozzle station 72 using cylinder device (positioning device) 95, and positions nozzle accommodation device 77 at the middle level position H1 that is the first exchange position. Next, in step S204, control device 90 images fiducial mark 78 on nozzle accommodation device 77 positioned at the middle level position H1 using board camera 71, and recognizes the position of fiducial mark 78 by image processing.

After this, in step S206, control device 90 calculates the position of fiducial mark 78 with respect to a reference position P0 based on the recognition result recognized in step S104. In addition, calculated position data DA of fiducial mark 78 is stored in a predetermined storage area of storage device 94 of control device 90. Here, by recognizing the position of one pair of fiducial marks 78, it is possible to acquire the inclination on an XY-plane of nozzle accommodation device 77, and the data of the inclination is stored in a predetermined storage area of storage device 94.

Next, in step S208, control device 90 further lifts lifting and lowering member 86 using cylinder device 95, and positions nozzle accommodation device 77 at the upper level position H2 that is the second exchange position. Next, in step S210, control device 90 images fiducial mark 78 on nozzle accommodation device 77 positioned at the upper level position H2 using board camera 71, and recognizes the position of the fiducial mark 78 by image processing.

Next, in step S212, control device 90 calculates the position of the fiducial mark 78 with respect to the reference position P0 based on the recognition result recognized in step S110. In addition, calculated position data DB or the like of the fiducial mark 78 is stored in a predetermined storage area of storage device 94 of control device 90.

After this, in step S214, control device 90 lowers lifting and lowering member 86 to the lower end position using cylinder device 95, retracts nozzle accommodation device 77 to the lower level position H0 that is the retraction position, and finishes fiducial mark position calculation processing.

By the above-described steps S202, S206, S210, and S212, at the multiple height positions of nozzle accommodation device 77, fiducial mark position calculating section 93a (refer to FIG. 8) that recognizes each of the fiducial marks 78 and calculates each of the positions of the fiducial marks 78 at the multiple height positions based on the recognition results, is configured.

5. Nozzle Exchange Control Processing

Figure 10:
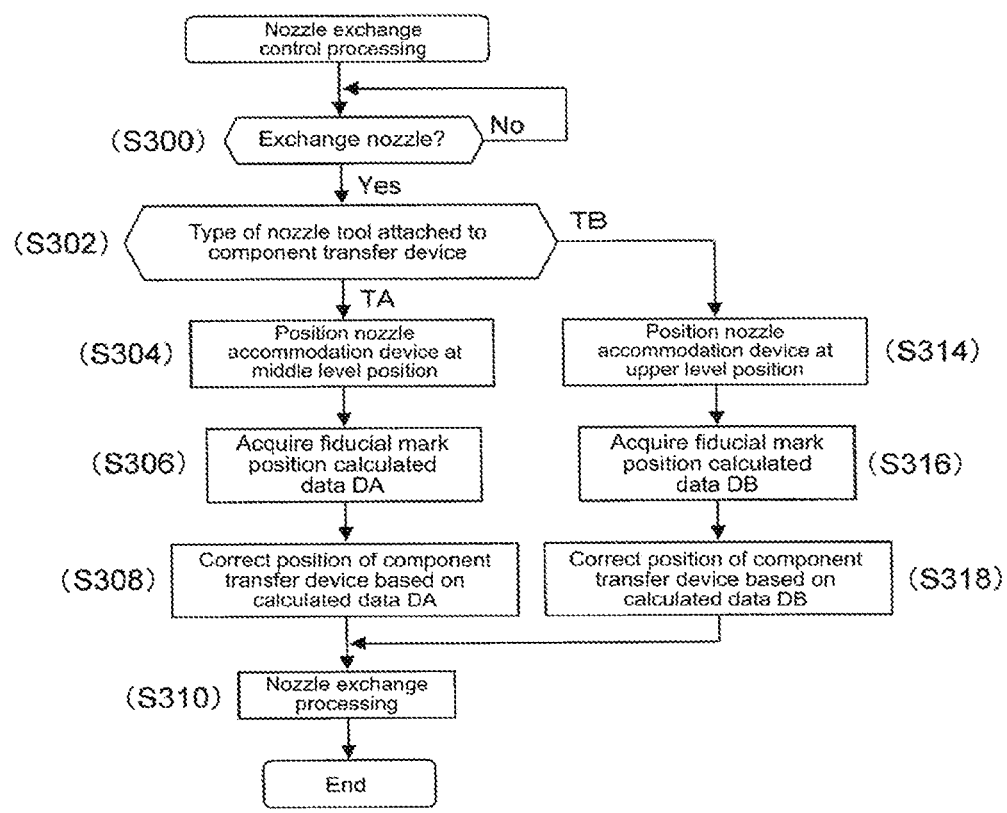
FIG. 10 is a flowchart illustrating nozzle exchange processing.

Next, a program of the nozzle exchange control processing for exchanging suction nozzle 66 with respect to nozzle tool 60 mounted on component transfer device 30 using control device 90 (exchange control device 93) in the middle of producing the board Bd with component mounting device 1 will be described based on the flowchart of FIG. 10.

In step S300, control device 90 determines whether a nozzle exchange command has been issued, and in a case where a nozzle exchange command has been issued, processing moves to step S302. Next, in step S302, control device 90 determines whether the type of nozzle tool 60 mounted on component transfer device 30 is an A type or a B type. In a case where it is determined that the type of nozzle tool 60 mounted on component transfer device 30 is an A type (TA), processing moves to step S304, and in a case where it is determined that the type of nozzle tool 60 mounted on component transfer device 30 is a B type (TB), processing moves to step S314.

In step S304, control device 90 controls cylinder device 95, lifts lifting and lowering member 86 on nozzle station 72, and positions nozzle accommodation device 77 at the middle level position H1 that is the first exchange position. After this, in step S306, control device 90 obtains the position data DA and the data of the inclination of fiducial mark 78 calculated by the fiducial mark position calculation processing before producing the board Bd using component mounting device 1, at the middle level position H1 of nozzle accommodation device 77 from a predetermined storage area of storage device 94.

Next, in step S308, control device 90 moves and controls component transfer device 30, and corrects the position of nozzle tool 60 in the X-axis direction and in the Y-axis direction, based on the position data DA and the data of the inclination of fiducial mark 78 that are obtained. In other words, as illustrated in FIG. 4, the position of nozzle tool is corrected only by a positional deviation amount of fiducial mark 78 (accommodation hole 87) by lifting nozzle accommodation device 77 to the middle level position H1 with respect to positions Xn and Yn based on the design of fiducial mark 78 with respect to the reference position P0, and each of the accommodation holes 87 of nozzle accommodation device 77 is aligned with respect to nozzle holder 61.

After this, in step S310, control device 90 exchanges suction nozzle 66 between each of the nozzle holders 61 of nozzle tool 60 and each of the accommodation holes 87 of nozzle accommodation device 77, by a known method.

Specifically, component transfer device 30 is moved and controlled, and nozzle holder 61 that holds the first suction nozzle 66 positioned at a passage Pr of nozzle tool 60 is positioned at a position that matches the accommodation hole 87 of nozzle accommodation device 77. In the state, nozzle holder 61 is lowered by the nozzle operation mechanism, nozzle holding device 68 is operated, the held state of the suction nozzle 66 is released, and the suction nozzle 66 is accommodated in the accommodation hole 87. After this, nozzle holder 61 is lifted, index shaft 52 rotates by a predetermined angle, and the nozzle holder 61 that holds the next suction nozzle 66 is indexed to the passage Pr position. Hereinafter, similarly, the lifting and lowering of nozzle holder 61 and the rotation of index shaft 52 are repeated, and all of the suction nozzles 66 held by nozzle tool 60 are accommodated in accommodation holes 87 of nozzle accommodation device 77.

Next, similar to the description above, the lifting and lowering of nozzle holder 61 and the rotation of index shaft 52 are repeated, and each of the suction nozzles for exchange 66 accommodated in accommodation holes 87 is consecutively mounted on each of the nozzle holders 61 of nozzle tool 60.

Accordingly, even when the position of fiducial mark 78 is deviated by the lifting of nozzle accommodation device 77 to the middle level position H1, the positional deviation is corrected, and in a state where the center of nozzle holder 61 and the center of the accommodation hole 87 match each other, it is possible to perform the exchange of suction nozzle 66, and to stably perform the exchange of suction nozzle 66 with respect to the multiple types of nozzle tools 60 without a mistake.

Meanwhile, in a case where it is determined that the type of nozzle tool 60 mounted on component transfer device 30 is the B type (TB), in step S314, the control device 90 controls cylinder device 95, lifts lifting and lowering member 86 on nozzle station 72, and positions nozzle accommodation device 77 at the upper level position H2 that is the second exchange position.

Next, in step S316, control device 90 obtains the position data DB or the like of fiducial mark 78 at the upper level position H2 of nozzle accommodation device 77 calculated by fiducial mark position calculation processing before producing the board Bd using component mounting device 1 from a predetermined storage area of storage device 94.

Next, in step S318, control device 90 moves and controls component transfer device 30 based on the obtained position data DB or the like of fiducial mark 78, and corrects the position of nozzle tool 60 in the X-direction and in the Y-direction. After this, in step S310, control device 90 similarly exchanges suction nozzle 66 to nozzle holder 61 similar to the description above.

By the above-described steps S308, S310, and S318, nozzle exchange control section 93b (refer to FIG. 8) that exchanges suction nozzle 66 by aligning nozzle tool 60 with respect to nozzle accommodation device 77 using the position of fiducial mark 78 calculated by fiducial mark position calculating section 93a as a reference, is configured.

According to the above-described embodiments, nozzle station 72 includes lifting and lowering member 86 capable of lifting and lowering; nozzle accommodation device 77 is provided on the lifting and lowering member 86, and accommodates the multiple types of suction nozzles 66 that correspond to the type of nozzle tool 60 to be attachable and detachable therein; positioning device 95 that positions lifting and lowering member 86 at the multiple height positions in accordance with the type of nozzle tool 60 mounted on component transfer device 30; and fiducial mark 78 that is provided on nozzle accommodation device 77, and exchange control device 93 includes fiducial mark position calculating section 93a that positions lifting and lowering member 86 at the multiple height positions using positioning device 95, recognizes each of the fiducial marks 78 at the multiple height positions, and calculates each of the positions of the fiducial marks 78 at the multiple height positions based on the recognition results, and nozzle exchange control section 93b that exchanges suction nozzle 66 by aligning nozzle tool 60 with respect to nozzle accommodation device 77 using the position of fiducial mark 78 calculated by fiducial mark position calculating section 93a as a reference when lifting and lowering member 86 is positioned at the multiple height positions in accordance with the exchange of nozzle tool 60.

Accordingly, it is possible to eliminate influence of the positional deviation of nozzle accommodation device 77 with respect to the reference position P0 arising between each of the height positions, and to specify a component mounting device 1 that can stably perform the exchange of suction nozzle 66 with respect to the multiple types of nozzle tools 60 without a mistake.

According to the above-described embodiments, lifting and lowering member 86 can be positioned at the lower level position H0 that is the retraction position, and at the middle level position H1 that is the first exchange position and at the upper level position H2 that is the second exchange position that correspond to the type of the nozzle tool 60. Accordingly, it is possible to automatically exchange the two types of suction nozzles 66 that correspond to the two types of nozzle tools 60, with respect to nozzle tool 60.

According to the above-described embodiment, there is provided a nozzle exchange method including: positioning lifting and lowering member 86 at the multiple height positions in accordance with the type of nozzle tool 60 mounted on component transfer device 30 before producing the board with component mounting device 1; recognizing each of the fiducial marks 78 at the multiple height positions; calculating each of the positions of the fiducial marks 78 at the multiple height positions based on the recognition results; and exchanging suction nozzle 66 by aligning nozzle tool 60 with respect to nozzle accommodation device 77 using the position of the fiducial mark 78 calculated at the respective height position as a reference when lifting and lowering member 86 is positioned at the multiple height positions in accordance with the exchange of nozzle tool 60.

Accordingly, it is possible to eliminate influence of the positional deviation of nozzle accommodation device 77 with respect to the reference position P0 arising between each of the height positions, and to achieve a nozzle exchange method that can stably perform the exchange of suction nozzle 66 with respect to the multiple types of nozzle tools 60 without a mistake.

In the above-described embodiments, an example in which the two types of nozzle tools 60, such as the A type and the B type, are exchanged is described, but by changing the setup, in a case in which it is possible to exchange a C type and a D type of nozzle tool 60, it is possible to obtain component mounting device 1 that can exchange four types of nozzle tools 60.

In the above-described embodiment, an example in which lifting and lowering member 86 is positioned at the middle level position H1 that is the first exchange position and at the upper level position H2 that is the second exchange position that correspond to the type of nozzle tool 60, each of the fiducial marks 78 is recognized at the two height positions (the middle level position H1 and the upper level position H2), and the positions of the fiducial marks 78 at the two height positions are respectively calculated based on the recognition results, is described.

However, the number of height positions at which the fiducial mark 78 is recognized is not limited to two described in the embodiment, and it is also possible to provide three or more height positions in accordance with the type of nozzle tool 60.

Figure 11:
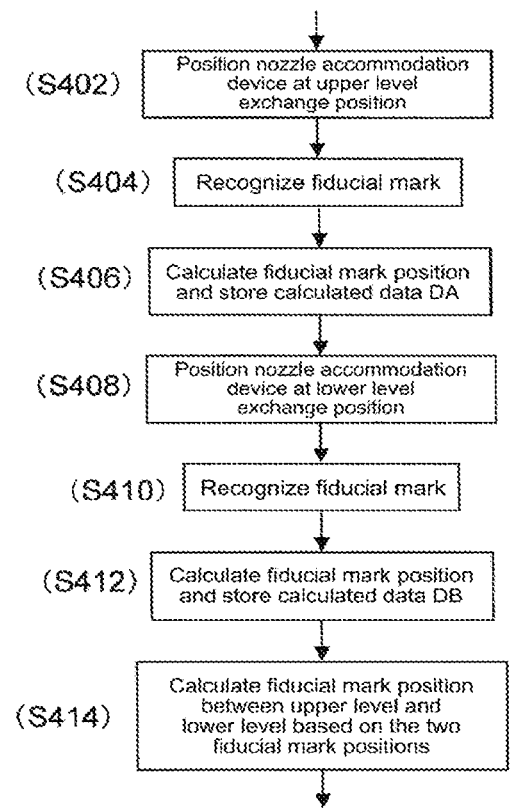
FIG. 11 is a flowchart illustrating an alternative embodiment of nozzle exchange preparation processing.

In this case, the positions of each of the fiducial marks 78 are not respectively recognized at three or more positions, and the position of fiducial mark 78 may be acquired by the calculation at the height position between the uppermost stage and the lowermost stage positions. In other words, as illustrated in FIG. 11, after calculating (steps S402 to S412) the positions of each of the fiducial marks 78 at the uppermost stage height position and at the lowermost stage height position, the position of the fiducial mark 78 may be acquired (step S414) by the calculation at the height position between the uppermost stage and the lowermost stage positions based on two pieces of calculated data.

Accordingly, in a case where there are three or more exchange positions, by simply recognizing the position of the fiducial mark 78 at the uppermost stage height position and at the lowermost stage height position, it is possible to acquire the position of the fiducial mark 78 at the exchange position between the uppermost stage and the lowermost stage positions, and to rapidly and easily perform calculation processing of the position of the fiducial mark 78.

In addition, in the above-described embodiment, an example in which multiple types of suction nozzles 66 are accommodated in nozzle accommodation device 77 provided on lifting and lowering member 86 is described, but the multiple types of suction nozzles 66 may be respectively accommodated in separated nozzle accommodation devices 77, and the multiple nozzle accommodation devices 77 may be provided to be aligned on lifting and lowering member 86.

In this manner, the present invention is not limited to the configuration described in the embodiment above, and various aspects can be employed within the range that does not depart from the spirit of the present invention described in the range of the claims.

INDUSTRIAL APPLICABILITY

The component mounting device and the nozzle exchange method which is used in the same according to the present invention are employed in automatically exchanging the multiple types of nozzle tools with respect to the component transfer device, and in automatically exchanging the suction nozzles that correspond to each of the nozzle tools, with respect to each of the nozzle tools.

REFERENCE SIGNS LIST

1: component mounting device, 10: board conveyance device, 20: component supply device, 30: component transfer device, 40: mounting head, 60: nozzle tool, 61: nozzle holder, 66: suction nozzle, 71: board camera, 72: nozzle station, 73: tool station, 77: nozzle accommodation device, 78: fiducial mark, 86: lifting and lowering member, 90: control device, 93: exchange control device, 93*a*: fiducial mark position calculating section, 93*b*: nozzle exchange control section, 95: positioning device (cylinder device)

The invention claimed is:
1. A component mounting device, comprising:
a component transfer device to which a nozzle tool that removably holds a suction nozzle is removably attached, the component transfer device being configured to transfer an electronic component picked up by the suction nozzle to a mounting position on a board by moving the nozzle tool;
a tool station configured to store the nozzle tool for exchange therein;
a nozzle station configured to store the suction nozzle for exchange therein; and
an exchange control device configured to attach the nozzle tool for exchange stored in the tool station to the component transfer device, and attach the suction nozzle for exchange accommodated in the nozzle station to the nozzle tool,
wherein the nozzle station includes
a lifting and lowering member capable of lifting and lowering, a nozzle accommodation device which is provided on the lifting and lowering member, and removably accommodates multiple types of the suction nozzle that correspond to the type of the nozzle tool, a positioning device configured to position the nozzle accommodation device on the lifting and lowering member at multiple height positions in accordance with the type of the nozzle tool attached to the component transfer device, and a fiducial mark provided on the nozzle accommodation device, and wherein the exchange control device includes a fiducial mark position calculating section configured to, when the nozzle accommodation device is positioned at the multiple height positions using the positioning device, recognize the fiducial mark at the multiple height positions, and calculate positions of the fiducial mark at the multiple height positions based on recognition results, and a nozzle exchange control section configured to, when the nozzle accommodation device is positioned at the multiple height positions in accordance with an exchange of the nozzle tool, exchange the suction nozzle by aligning the nozzle tool with respect to the nozzle accommodation device using the positions of the fiducial mark calculated by the fiducial mark position calculating section as a reference.

2. The component mounting device according to claim 1, wherein the nozzle accommodation device can be positioned at a lower level position that is a retraction position, and at a middle level position that is a first exchange position and an upper level position that is a second exchange position in accordance with the type of the nozzle tool.

3. The component mounting device according to claim 1, wherein the nozzle accommodation device can be positioned at three or more exchange positions, and the nozzle exchange control section calculates the positions of the fiducial mark at an uppermost exchange position and at a lowermost exchange position, and calculates the position of the fiducial mark at an exchange position between the uppermost exchange position and the lowermost exchange position based on the calculated positions of the fiducial mark at the uppermost exchange position and at the lowermost exchange position.

4. A nozzle exchange method used in a component mounting device including a component transfer device to which a nozzle tool that removably holds a suction nozzle is removably attached, the component transfer device being configured to transfer an electronic component picked up by the suction nozzle to a mounting position on a board by moving the nozzle tool, a tool station configured to store the nozzle tool for exchange therein, a nozzle station configured to store the suction nozzle for exchange therein, and an exchange control device configured to attach the nozzle tool for exchange stored in the tool station to the component transfer device, and attach the suction nozzle for exchange accommodated in the nozzle station to the nozzle tool, wherein, the nozzle station includes a lifting and lowering member capable of lifting and lowering and provided with a fiducial mark, a nozzle accommodation device provided on the lifting and lowering member, the nozzle accommodation device removably accommodating multiple types of the suction nozzles that correspond to the type of the nozzle tool, and a positioning device configured to position the nozzle accommodation device on the lifting and lowering member at multiple height positions in accordance with the type of the nozzle tool attached to the component transfer device, the nozzle exchange method comprising:

positioning the nozzle accommodation device at the multiple height positions in accordance with the type of the nozzle tool attached to the component transfer device before producing the board with the component mounting device;

recognizing the fiducial mark at the multiple height positions;

calculating each positions of the fiducial mark at the multiple height positions based on the recognition results; and exchanging the suction nozzle by aligning the nozzle tool with respect to the nozzle accommodation device using the positions of the fiducial mark calculated at the multiple height position as a reference when the nozzle accommodation device is positioned at the multiple height positions in accordance with an exchange of the nozzle tool.

\* \* \* \* \*